United States Patent
Kiyose

Patent Number: 5,401,686
Date of Patent: Mar. 28, 1995

[54] METHOD OF UNIFORMLY DIFFUSING IMPURITIES INTO SEMICONDUCTOR WAFERS

[75] Inventor: Hiromi Kiyose, Kyoto, Japan

[73] Assignee: Rohm Co., Ltd., Kyoto, Japan

[21] Appl. No.: 909,600

[22] Filed: Jul. 7, 1992

[30] Foreign Application Priority Data

Aug. 7, 1991 [JP] Japan .................. 3-223423

[51] Int. Cl.[6] .......................................... H01L 21/223
[52] U.S. Cl. ..................... 437/166; 437/949; 148/DIG. 38
[58] Field of Search ............... 437/138, 141, 145, 146, 437/160, 165, 166, 168, 169, 949; 148/DIG. 22, DIG. 30, DIG. 37, DIG 38, DIG. 71; 118/716, 725

[56] References Cited

U.S. PATENT DOCUMENTS

| | | | |
|---|---|---|---|
| 2,804,405 | 8/1957 | Derick et al. | 437/166 |
| 2,873,222 | 2/1959 | Derick et al. | 437/168 |
| 4,032,373 | 6/1977 | Koo | 437/904 |
| 4,348,580 | 9/1982 | Drexel | 437/165 |
| 4,711,989 | 12/1987 | Yu | 118/725 |

Primary Examiner—Brian E. Hearn
Assistant Examiner—C. Chaudhari
Attorney, Agent, or Firm—Brumbaugh, Graves, Donohue & Raymond

[57] ABSTRACT

The temperature of the front heater is set to a higher value than the set temperature of the center heater and the temperature of the rear heater is set to a lower value than the set temperature of the center heater to thereby provide such a temperature gradient that the temperature of a center heater region gradually rises from the rear side toward the front side and the impurity diffusion is accelerated under the temperature gradient, whereby it is possible to compensate for the decrease in the quantity of the diffused impurity caused by the lowering of the impurity concentration of the impurity gas gradually from the rear side toward the front side, so that the impurity is uniformly diffused into the wafers located in the core pipe.

2 Claims, 3 Drawing Sheets

METHOD OF UNIFORMLY DIFFUSING IMPURITIES INTO SEMICONDUCTOR WAFERS

BACKGROUND OF THE INVENTION

The present invention relates to a method for diffusing an impurity into semiconductor wafers by introduction of a gas containing the impurity from one end of a horizontal diffusion furnace.

A horizontal diffusion furnace used for diffusion of an impurity into semiconductor wafers (hereinafter merely referred to as "wafers") generally has heating means separated into three heaters. That is, the heater means has a front heater provided at the opening side of a core pipe through which the wafers are introduced, a center heater provided at the center portion of the core pipe on which the wafers are mounted, and a rear heater provided at the side through which an impurity gas is introduced. The heaters are arranged so that the respective temperatures thereof can be controlled separately. The temperature of a center heater region is set to a range of, for example, ±1.0° C. with respect to the set temperature thereof, by adjusting the respective values of power for the front and rear heaters.

After a plurality of wafers mounted on a quartz boat has been introduced into the center heater region in the horizontal diffusion furnace which has been set to a uniform temperature as described above, an impurity gas such as phosphorus oxychloride (POCl₃), boron (BBr₃) or the like is introduced from the closing side (rear heater side) of the core pipe to carry out diffusion of the impurity into the semiconductor wafers.

However, the aforementioned conventional impurity diffusing method has the following problem.

That is, an impurity introduced from the rear side of the horizontal diffusion furnace is deposited on the wafers successively in order of starting from the rear-side wafers, so that the concentration of the impurity gas decreases as the impurity gas goes toward the front side. As is obvious from FIG. 5, the quantity of impurity diffused into wafers decreases as the impurity concentration of the introduced gas decreases. From this reason, the conventional impurity diffusing method has a problem in that the quantity of impurity diffused into wafers decreases in the order of arrangement of the wafers from the rear side to the front side, and that this results in scattering in quantity of impurity among the wafers.

As a measure to overcome the aforementioned problem, it may be considered to reduce the number of wafers introduced into the horizontal diffusion furnace to thereby suppress the variations in concentration of the impurity gas. However, there arises another problem in that treatment efficiency in the diffusing step is lowered.

SUMMARY OF THE INVENTION

The present invention has been made in view of such circumstances and an object thereof is to provide an impurity diffusing method in which an impurity can be uniformly diffused into wafers in a horizontal diffusion furnace without reducing the treatment efficiency in the diffusing step.

In order to achieve the foregoing object, the present invention has the following configuration.

That is, the present invention provides a method for diffusing an impurity into semiconductor wafers by introduction of an impurity gas into a core pipe from a rear side of a horizontal diffusion furnace having at least a front heater provided at an opening side of the core pipe, a center heater provided at a center portion of the core pipe and a rear heater provided at a closing side of the core pipe, characterized in that the temperature of the front heater is set to a higher value than the set temperature of the center heater and the temperature of the rear heater is set to a lower value than the set temperature of the center heater to thereby provide a temperature gradient so that the temperature of a center heater region gradually rises from the rear side toward the front side and the impurity diffusion is carried out under the temperature gradient.

The operation of the present invention is as follows.

Reference is made to FIG. 4, which is a characteristic graph showing the relation between the temperature of each of diffused phosphorus (P) and boron (B) which are general impurities and the impurity concentration. As seen from this graph, in the ordinary diffusion temperature range, the impurity concentration in the semiconductor wafers (silicon) increases as the diffusion temperature increases. That is, according to the present invention, a temperature gradient is set such that the temperature in the center heater region into which the semiconductor wafers are introduced becomes gradually higher from its rear side to its front side so that the diffusion of impurity is accelerated. By this, it is possible to compensate for the decrease in the quantity of the diffused impurity caused by the lowering of the impurity concentration of the impurity gas gradually from the rear side toward the front side. As a result, the impurity is uniformly diffused into the wafers located in the center heater region.

DETAILED DESCRIPTION OF THE INVENTION

A preferred embodiment of the present invention will be described hereunder with reference to the drawings.

Figure 1:
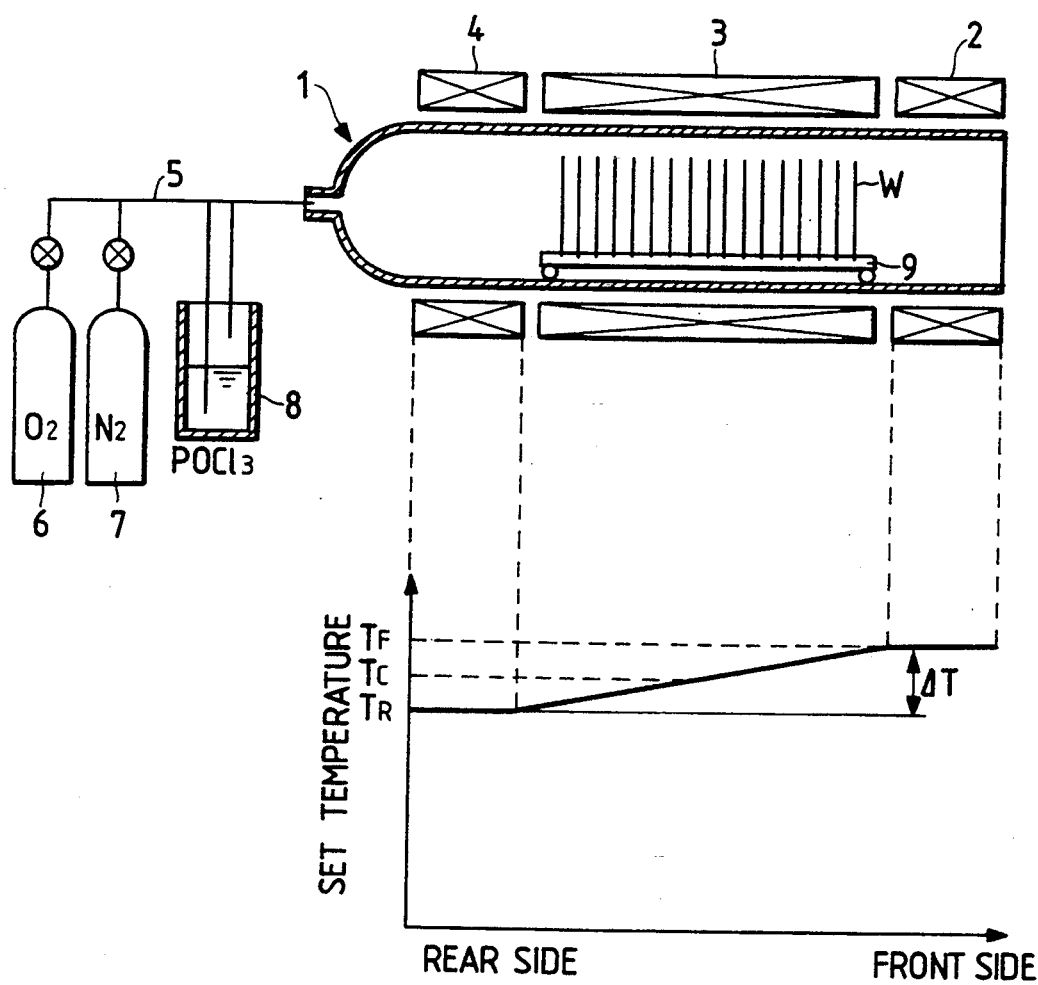
FIG. 1 is an explanatory view of an embodiment of a method for diffusing impurities to semiconductor wafers according to the present invention.

FIG. 1 is an explanatory view of an embodiment of a method for diffusing impurities to semiconductor wafers according to the present invention. In the drawing, the reference numeral 1 designates a core pipe. In the surroundings of the core pipe 1, a front heater 2, a center heater 3 and a rear heater 4 are provided at the opening end side (front side) through which wafers are introduced, at the center region where the wafers are mounted, and at the closing side (rear side) through which an impurity gas is introduced, respectively. At the closing side of the core pipe 1, an oxygen gas supply source 6, a nitrogen gas supply source 7 and an impurity vapor generator 8 for generating vapors of phosphorus oxychloride (POCl₃) are parallelly connected through a piping 5. In the drawing, the reference symbol W designates semiconductor wafers (silicon) mounted on a quartz boat and inserted into the center heater region of the core pipe 1.

In this embodiment, an atmosphere in the core pipe 1 is adjusted by flowing a nitrogen gas and an oxygen gas of the order of several percent with respect to the nitrogen gas, and phosphorus oxychloride of the order of several percent with respect to the flow rate of the nitrogen gas is made to flow into the core pipe having the atmosphere to thereby perform the diffusion of phosphorus into the semiconductor wafers W. As shown in FIG. 1, the respective temperatures are set so that the set temperature $T_F$ of the front heater 2 is slightly higher than the set temperature $T_C$ of the center heater 3 and that the set temperature $T_R$ of the rear heater 4 is slightly lower than the set temperature $T_C$ of the center heater 3. As a result, the center heater region where the semiconductor wafers W are mounted has such a temperature gradient $\Delta T$ that the temperature increases gradually from its rear side to its front side.

Figure 2:
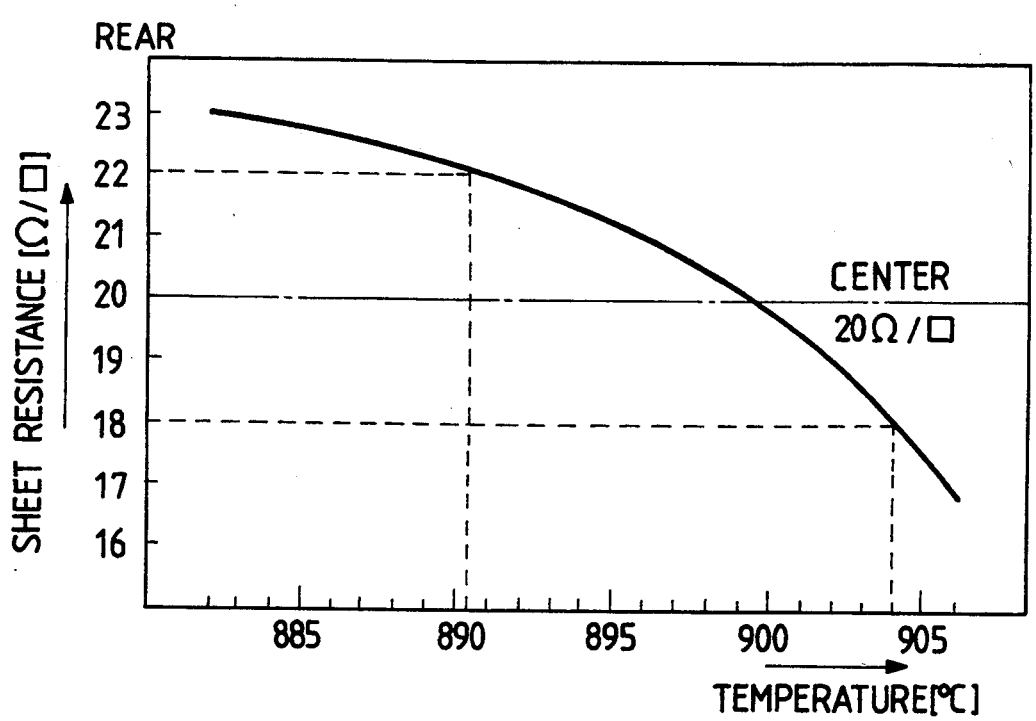
FIG. 2 is a characteristic graph showing the relation between the sheet resistance value and the diffusion temperature in the case of a rear-side wafer in the diffusing method according to the present invention.
Figure 3:
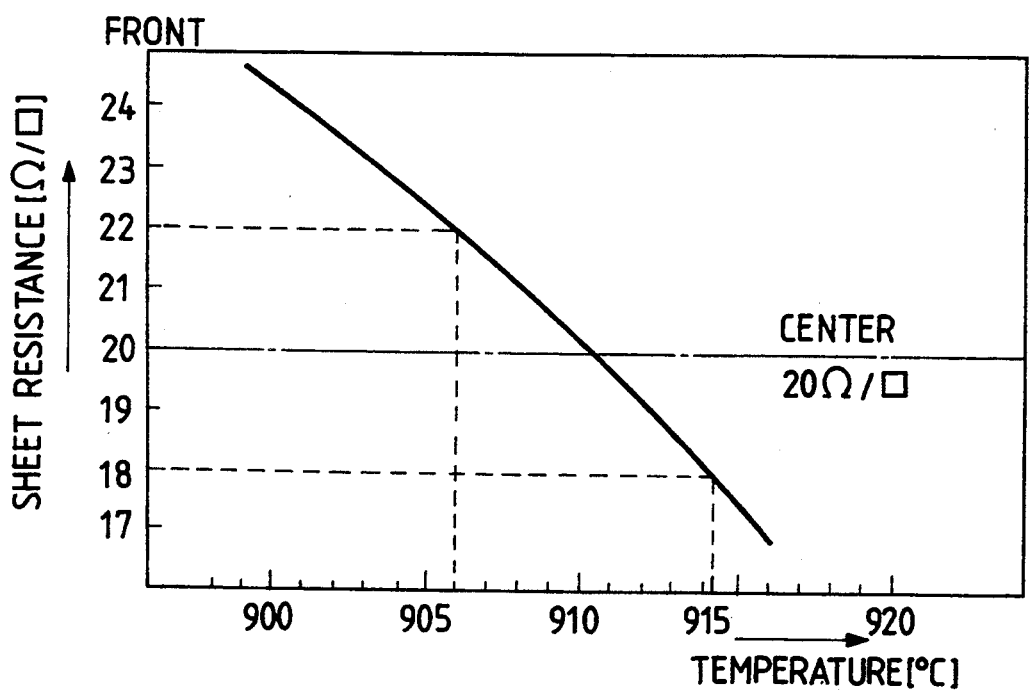
FIG. 3 is a characteristic graph showing the relation between the sheet resistance value and the diffusion temperature in the case of a front-side wafer in the diffusing method according to the present invention.
Figure 4:
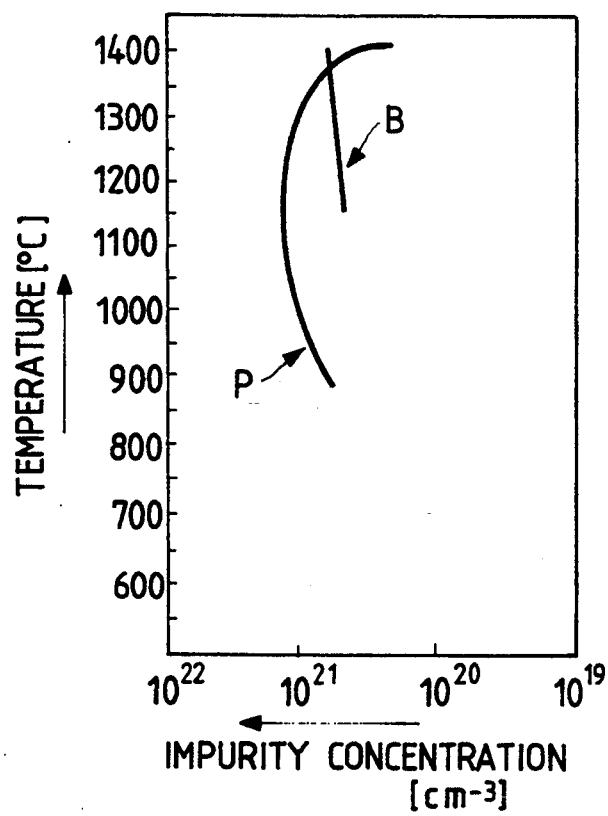
FIG. 4 is a characteristic graph showing the relations between the respective diffusion temperatures of typical impurities and the impurity concentration.
Figure 5:
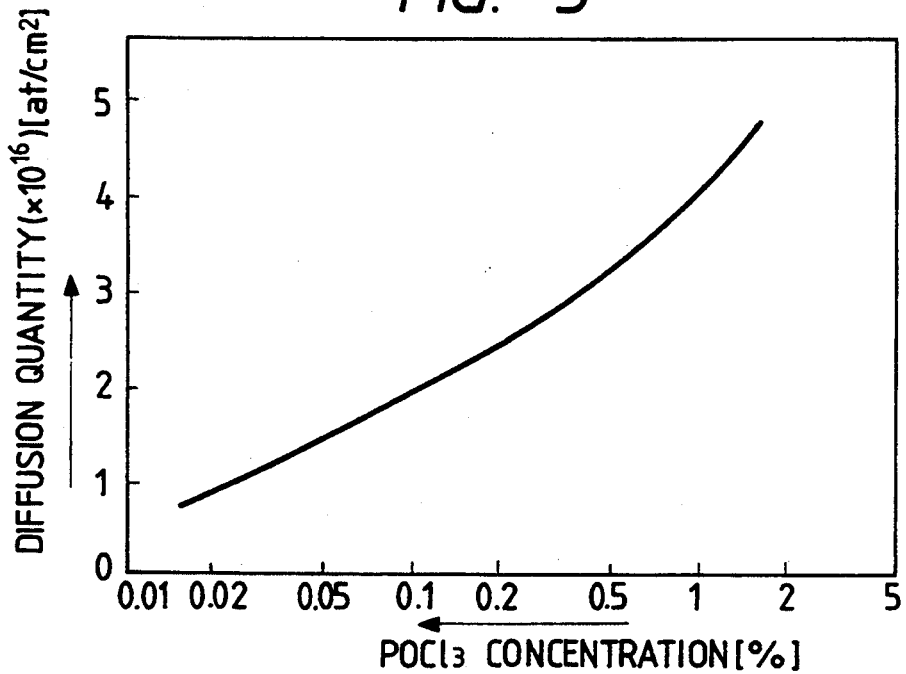
FIG. 5 is a characteristic graph showing the relation between the impurity concentration of the introduced gas and the diffusion quantity.

An example of the setting of the temperature gradient in the center heater region will be described hereunder with reference to FIGS. 2 and 3. In each of FIGS. 2 and 3, the ordinate represents a sheet resistance value corresponding to the quantity of phosphorus diffused to wafers, and the abscissa represents an intra-furnace temperature. Particularly, FIG. 2 shows the relation between the sheet resistance value and the diffusion temperature in the case of a rear-side wafer, and FIG. 3 shows the relation between the sheet resistance value and the diffusion temperature in the case of a front-side wafer. In this example, the set temperature of the center heater 3 is 900° C., and the flow rates of the nitrogen gas, oxygen gas and phosphorus oxychloride gas are set to 8000 cc/min, 400 cc/min and 350 cc/min, respectively.

At that time, if a carrier gas flow rate in the core pipe is made to be not more than 2,000 cc/min, the impurity gas does not reach the front side so that uniform characteristic can not be obtained, regardless of the temperature gradient. Alternatively, if the gas flow rate is made to be not less than 15,000 cc/min, it becomes difficult for the gas to come into between wafers so that the uniformity of the wafer surfaces deteriorates. Accordingly, it is necessary to make the gas flow rate to be in a range of from 2,000 cc/min to 15,000 cc/min.

As seen from FIG. 2, it is necessary to set the rear-side temperature in a range of about 890° to about 904° C. to obtain a desired diffusion quantity in the case where the desired diffusion quantity is in a range of $\pm 2\Omega/\square$ with respect to the sheet resistance value of a center-region wafer of $20\Omega/\square$. On the other hand, as seen from FIG. 3, it is necessary to limit the front-side set temperature in a range of about 906° to about 914° C. to set the sheet resistance value in an allowable range in the same case as described above. It is apparent from the aforementioned results that the temperature gradient $\Delta T$ of the center heater region is preferably set in a range of about 2° to about 10° C. to set the quantity of diffusion to the respective wafer in the center heater region in a desired range. According to an experiment, the more preferred temperature gradient $\Delta T$ to make the quantity of diffusion into the wafers uniform was 5° to 10° C.

The optimum temperature gradient of the center heater region is affected by diffusion conditions such as the set temperature of the center heater 3, the flow rate of the carrier gas, the concentration of the impurity gas, and the like. Accordingly, it is preferable that the gradient is determined experimentally correspondingly to the diffusion conditions.

Although the aforementioned embodiment has shown the case where diffusion of phosphorus is performed by using phosphorus oxychloride, the present invention can be applied to the case where other impurities such as boron and the like may be diffused.

Although the embodiment has shown the case where the diffusion furnace has heating means separated into three heaters, it is a matter of course that the invention can be applied to the case where the diffusion furnace may have heating means separated into a larger number of heaters.

As is obvious from the above description, according to the present invention, a temperature gradient is set such that the temperature in the center heater region in which the semiconductor wafers are mounted becomes gradually higher from its rear side to its front side so that the diffusion of impurity is accelerated. By this, it is possible to compensate for the decrease in the quantity of the diffused impurity caused by the lowering of the impurity concentration of the impurity gas gradually from the rear side toward the front side, so that the impurity is uniformly diffused into the wafers located in the center heater region.

What is claimed is:

1. A method of diffusing an impurity into semiconductor wafers, comprising the steps of:

inserting said semiconductor wafers into a core pipe of a horizontal diffusion furnace having at least a first heater provided at an opening side of said core pipe, a second heater provided at a center portion of said core pipe and a third heater provided at a closing side of said core pipe;

mounting said semiconductor wafers at said center portion of said core pipe so that they are spaced in the direction from the opening side to the closing side of the pipe;

setting a temperature of said first heater to a higher value than a set temperature of said second heater and setting a temperature of said third heater to a lower value than the set temperature of said second heater to thereby provide such a temperature gradient that a temperature in said core pipe at a region of said second heater gradually rises from a side of said third heater toward a side of said first heater;

flowing a carrier gas and an impurity gas through said core pipe from the closing side to the opening side; and diffusing the impurity into said wafers so that the impurity concentration in the impurity gas decreases as the gas flows past the wafers from the closing side toward the opening side and setting said temperature gradient to cause an increasing rate of impurity diffusion into the wafers from the closing side toward the opening side of the core pipe to compensate for the decreasing concentration of impurity in the impurity gas.

2. A method of diffusing an impurity as claimed in claim 1, wherein said temperature gradient is 2°–10° C. and a flow rate of said carrier gas is 2,000–15,000 cc/min.

* * * * *